US012660611B2

(12) United States Patent
Hu et al.

(10) Patent No.: US 12,660,611 B2
(45) Date of Patent: Jun. 16, 2026

(54) SEMICONDUCTOR DEVICE WITH INTEGRATED DEEP TRENCH CAPACITORS

(71) Applicant: MEDIATEK INC., Hsin-Chu (TW)

(72) Inventors: Chu-Wei Hu, Hsinchu City (TW); Chien-Kai Huang, Hsinchu City (TW); Tien-Yu Lu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 573 days.

(21) Appl. No.: 18/097,296

(22) Filed: Jan. 16, 2023

(65) Prior Publication Data

US 2023/0260894 A1      Aug. 17, 2023

Related U.S. Application Data

(60) Provisional application No. 63/311,095, filed on Feb. 17, 2022.

(51) Int. Cl.
*H10W 20/40*          (2026.01)
*H10B 80/00*          (2026.01)
(Continued)

(52) U.S. Cl.
CPC .......... *H10W 20/496* (2026.01); *H10B 80/00* (2023.02); *H10W 20/427* (2026.01); *H10W 90/401* (2026.01); *H10W 90/701* (2026.01); *H10W 72/853* (2026.01); *H10W 72/952* (2026.01); *H10W 72/967* (2026.01);
(Continued)

(58) Field of Classification Search
CPC .......... H01L 23/5223; H01L 23/49816; H01L 23/49833; H01L 23/5286; H01L 24/05;

H01L 24/08; H01L 24/09; H01L 24/16; H01L 24/24; H01L 24/73; H01L 2224/05647; H01L 2224/08145; H01L 2224/09515; H01L 2224/16225; H01L 2224/24225; H01L 2224/73209; H01L 23/5385; H01L 25/18; H01L 23/642;
(Continued)

(56) References Cited

U.S. PATENT DOCUMENTS 8,609,486 B1 * 12/2013 Smeys ................... H10D 1/047
                                                              438/243
9,331,062 B1 * 5/2016 Lane ................. H01L 21/76801
(Continued)

FOREIGN PATENT DOCUMENTS

CN          110190056 A        8/2019
CN          109427753 B    *  7/2021    ............. H10D 86/85
(Continued)

OTHER PUBLICATIONS

Xiaowu Zhang et al., Heterogeneous 2.5D integration on through silicon interposer, AIP Journal of Applied physics, 2015, Applied Physics Reviews 2, Coverpage & p. 1-58, AIP Publishing LLC, XP055776606, 2015.
(Continued)

*Primary Examiner* — Scott B Geyer
(74) *Attorney, Agent, or Firm* — Winston Hsu

(57) ABSTRACT

A semiconductor device includes an application processor (AP) die and a memory die directly bonded to the AP die. The memory die includes a substrate, a non-volatile memory structure on the substrate, and at least one trench capacitor in the substrate.

10 Claims, 4 Drawing Sheets

(51) Int. Cl.

| | |
|---|---|
| *H10W 20/41* | (2026.01) |
| *H10W 72/00* | (2026.01) |
| *H10W 72/90* | (2026.01) |
| *H10W 90/00* | (2026.01) |

(52) U.S. Cl.
CPC .......... *H10W 90/00* (2026.01); *H10W 90/724* (2026.01); *H10W 90/792* (2026.01)

(58) Field of Classification Search
CPC . H01L 25/0655; H01L 25/0657; H10B 53/40; H10B 63/80; H10D 1/665
See application file for complete search history.

(56) References Cited

U.S. PATENT DOCUMENTS

| | | | | |
|---|---|---|---|---|
| 10,510,738 | B2 * | 12/2019 | Kim | H01L 24/80 |
| 11,201,205 | B2 * | 12/2021 | Tsai | H10B 12/37 |
| 2006/0105496 | A1 * | 5/2006 | Chen | H01L 24/94 |
| | | | | 257/E21.597 |
| 2008/0153200 | A1 * | 6/2008 | Sitaram | H01L 25/18 |
| | | | | 257/E21.597 |
| 2009/0090950 | A1 * | 4/2009 | Forbes | H01L 25/18 |
| | | | | 438/243 |
| 2015/0001675 | A1 * | 1/2015 | Chang | H10D 1/68 |
| | | | | 257/532 |
| 2015/0049537 | A1 | 2/2015 | Sim | |
| 2015/0102395 | A1 * | 4/2015 | Park | H10D 1/047 |
| | | | | 257/301 |
| 2015/0102459 | A1 * | 4/2015 | Lai | H10D 1/692 |
| | | | | 257/532 |
| 2015/0288174 | A1 * | 10/2015 | Di Sarro | H02H 9/046 |
| | | | | 361/56 |
| 2015/0325572 | A1 * | 11/2015 | Cheng | H01L 21/3083 |
| | | | | 438/210 |
| 2016/0240527 | A1 * | 8/2016 | Ramachandran | |
| | | | | H01L 23/49822 |
| 2016/0379988 | A1 * | 12/2016 | Chuang | H10B 43/40 |
| | | | | 438/242 |
| 2019/0164905 | A1 | 5/2019 | Hsieh | |
| 2019/0229181 | A1 | 7/2019 | Jia | |
| 2020/0006367 | A1 * | 1/2020 | Krutzik | G11C 5/025 |
| 2020/0259080 | A1 * | 8/2020 | Tanzawa | H10N 70/841 |
| 2020/0328186 | A1 * | 10/2020 | Liu | H01L 25/18 |
| 2020/0350014 | A1 * | 11/2020 | Liu | H01L 21/50 |
| 2020/0402579 | A1 * | 12/2020 | Park | G11C 29/04 |
| 2020/0402903 | A1 * | 12/2020 | Chen | H01L 23/481 |
| 2021/0035993 | A1 * | 2/2021 | Chen | H10B 53/40 |
| 2021/0066320 | A1 * | 3/2021 | Kim | H10B 51/00 |
| 2021/0249952 | A1 * | 8/2021 | Roth | H01L 25/18 |
| 2021/0305398 | A1 * | 9/2021 | Chang | H10D 1/62 |
| 2021/0407942 | A1 * | 12/2021 | Yu | H01L 24/19 |
| 2022/0028829 | A1 * | 1/2022 | Cheng | H01L 21/78 |
| 2022/0223530 | A1 * | 7/2022 | Yu | H01L 24/16 |
| 2022/0367734 | A1 * | 11/2022 | Kuo | H10D 1/042 |
| 2022/0415896 | A1 * | 12/2022 | Alzate-Vinasco | |
| | | | | H10B 12/0335 |
| 2023/0132574 | A1 * | 5/2023 | Zhao | H10B 12/482 |
| | | | | 257/296 |
| 2023/0207445 | A1 * | 6/2023 | Sharma | H10D 88/00 |
| | | | | 257/734 |
| 2023/0260977 | A1 * | 8/2023 | Chen | H01L 24/16 |
| | | | | 257/690 |
| 2023/0380136 | A1 * | 11/2023 | Liu | H10B 12/50 |
| 2024/0030135 | A1 * | 1/2024 | Lee | H01L 23/49816 |
| 2024/0030359 | A1 * | 1/2024 | Su | H10D 1/665 |
| 2024/0063148 | A1 * | 2/2024 | Foo | H01L 21/4846 |
| 2024/0128193 | A1 * | 4/2024 | Lee | H01L 24/16 |
| 2024/0222326 | A1 * | 7/2024 | Suthram | H10B 10/12 |
| 2024/0222328 | A1 * | 7/2024 | Suthram | H01L 25/0657 |
| 2024/0224542 | A1 * | 7/2024 | Blair | G11C 5/14 |
| 2025/0219021 | A1 * | 7/2025 | Shan | H01L 23/49816 |

FOREIGN PATENT DOCUMENTS

| | | |
|---|---|---|
| TW | 386288 | 4/2000 |
| TW | 202115883 A | 4/2021 |

OTHER PUBLICATIONS

Zhe Li et al., Development of an Optimized Power Delivery System for 3D IC Integration with TSV Silicon Interposer, 2012, p. 678-682, IEEE, XP032210658, 2012.

* cited by examiner

SEMICONDUCTOR DEVICE WITH INTEGRATED DEEP TRENCH CAPACITORS

CROSS REFERENCE TO RELATED APPLICATIONS

This application claims the benefit of U.S. Provisional Application No. 63/311,095, filed on Feb. 17, 2022. The content of the application is incorporated herein by reference.

BACKGROUND

The instant disclosure relates generally to the field of semiconductor technology.

The rapid advancements in artificial intelligence (AI) are being enabled by advanced GPU's and specialized AI processors utilizing the most advanced silicon process nodes at 5 nm.

High-performance processors require higher steady-state and peak currents with dramatically increasing slew rates, while operating at lower voltages with an increasing number of high-speed I/Os. This trend is accelerating and continually challenging power system designers to ensure delivery of adequate power to the processor core with low loss in the Power Delivery Network (PDN).

Decoupling capacitors such as metal-insulator-metal (MIM) or high-k based deep trench capacitors (HK DTC) are commonly used to reduce the impedance of a power distribution system. To accommodate the exceedingly demanding power integrity (PI) requirements for the advanced AI and high-performance computing (HPC) components, high-K based deep trench capacitors have been integrated in the silicon interposer with through silicon via (TSV) and fine-pitch interconnects for chip-on-wafer-on-substrate (CoWoS) integration.

It is desirable to provide high-performance decoupling capacitor to mitigate voltage drop and noise ripple issues and low power memory to reduce power consumption.

SUMMARY

One object of the present invention is to provide an improved semiconductor device with integrated deep trench capacitors in order to solve the above-mentioned prior art problems or shortcomings.

One aspect of the invention provides a semiconductor device including an application processor (AP) die and a memory die directly bonded to the AP die. The memory die includes a substrate, a non-volatile memory structure on the substrate, and at least one trench capacitor in the substrate.

According to some embodiments, the at least one trench capacitor is a decoupling capacitor.

According to some embodiments, the non-volatile memory structure comprises a magneto-resistive random access memory (MRAM) structure, a resistive random access memory (RRAM) structure, or a phase-change random access memory (PCRAM) structure.

According to some embodiments, a first hybrid bond pad and a second hybrid bond pad are disposed on an upper surface of the memory die According to some embodiments, the first hybrid bond pad is a memory pin for transmitting signals such as read, erase, or program signals between the AP die and the memory die, and the second hybrid bond pad is a power pin for transmitting power signals.

According to some embodiments, the at least one trench capacitor is electrically connected to the second hybrid bond pad.

According to some embodiments, the first and second hybrid bond pads are directly bonded to third and fourth hybrid bond pads on the AP die, respectively, through hybrid bonding.

According to some embodiments, the first hybrid bond pad, the second hybrid bond pad, the third hybrid bond pad, and the fourth hybrid bond pad are copper pads.

According to some embodiments, the at least one trench capacitor is connected to a pad.

According to some embodiments, the second hybrid bond pad is electrically connected to the pad through a power supply line.

Another aspect of the invention provides a semiconductor device including a package substrate, an application processor (AP) die mounted on the package substrate, and a memory die mounted on the package substrate. The memory die includes a substrate, a non-volatile memory structure on the substrate, and at least one trench capacitor in the substrate.

According to some embodiments, the at least one trench capacitor is a decoupling capacitor.

According to some embodiments, the non-volatile memory structure comprises a magneto-resistive random access memory (MRAM) structure, a resistive random access memory (RRAM) structure, or a phase-change random access memory (PCRAM) structure.

According to some embodiments, a first bond pad and a second bond pad are disposed on an upper surface of the memory die.

According to some embodiments, the first bond pad is a memory pin for transmitting signals such as read, erase, or program signals between the AP die and the memory die.

According to some embodiments, the second bond pad is a power pin for transmitting power signals.

According to some embodiments, the at least one trench capacitor is connected to a pad.

According to some embodiments, the second bond pad is electrically connected to the pad through a power supply line.

According to some embodiments, a re-distribution layer is disposed on the upper surface of the memory die.

According to some embodiments, the memory die is electrically connected to the package substrate through the re-distribution layer.

Still another aspect of the invention provides a semiconductor device including a package substrate; an interposer substrate on the package substrate; an application processor (AP) die mounted on the interposer substrate; and a memory die mounted on the interposer substrate, wherein the memory die comprises a substrate, a non-volatile memory structure on the substrate, and at least one trench capacitor in the substrate.

According to some embodiments, the at least one trench capacitor is a decoupling capacitor.

According to some embodiments, the non-volatile memory structure comprises a magneto-resistive random access memory (MRAM) structure, a resistive random access memory (RRAM) structure, or a phase-change random access memory (PCRAM) structure.

According to some embodiments, a first bond pad and a second bond pad are disposed on an upper surface of the memory die, wherein the first bond pad is a memory pin for transmitting signals such as read, erase, or program signals between the AP die and the memory die.

According to some embodiments, the second bond pad is a power pin for transmitting power signals.

According to some embodiments, the at least one trench capacitor is connected to a pad.

According to some embodiments, the second bond pad is electrically connected to the pad through a power supply line.

According to some embodiments, a re-distribution layer is disposed on the upper surface of the memory die.

According to some embodiments, the memory die is electrically connected to the package substrate through the re-distribution layer.

According to some embodiments, the interposer substrate is a silicon interposer.

Still another aspect of the invention provides a semiconductor device including a package substrate; an application processor (AP) die mounted on the package substrate; and a memory die embedded in the package substrate, wherein the memory die comprises a substrate, a non-volatile memory structure on the substrate, and at least one trench capacitor in the substrate.

According to some embodiments, the memory die is electrically connected to the AP die through an interconnect structure of the package substrate.

According to some embodiments, the non-volatile memory structure comprises a magneto-resistive random access memory (MRAM) structure, a resistive random access memory (RRAM) structure, or a phase-change random access memory (PCRAM) structure.

According to some embodiments, a first bond pad and a second bond pad are disposed on an upper surface of the memory die, wherein the first bond pad is a memory pin for transmitting signals such as read, erase, or program signals between the AP die and the memory die.

According to some embodiments, the second bond pad is a power pin for transmitting power signals.

According to some embodiments, a re-distribution layer is disposed on the upper surface of the memory die.

According to some embodiments, the memory die is electrically connected to the package substrate through the re-distribution layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 1:
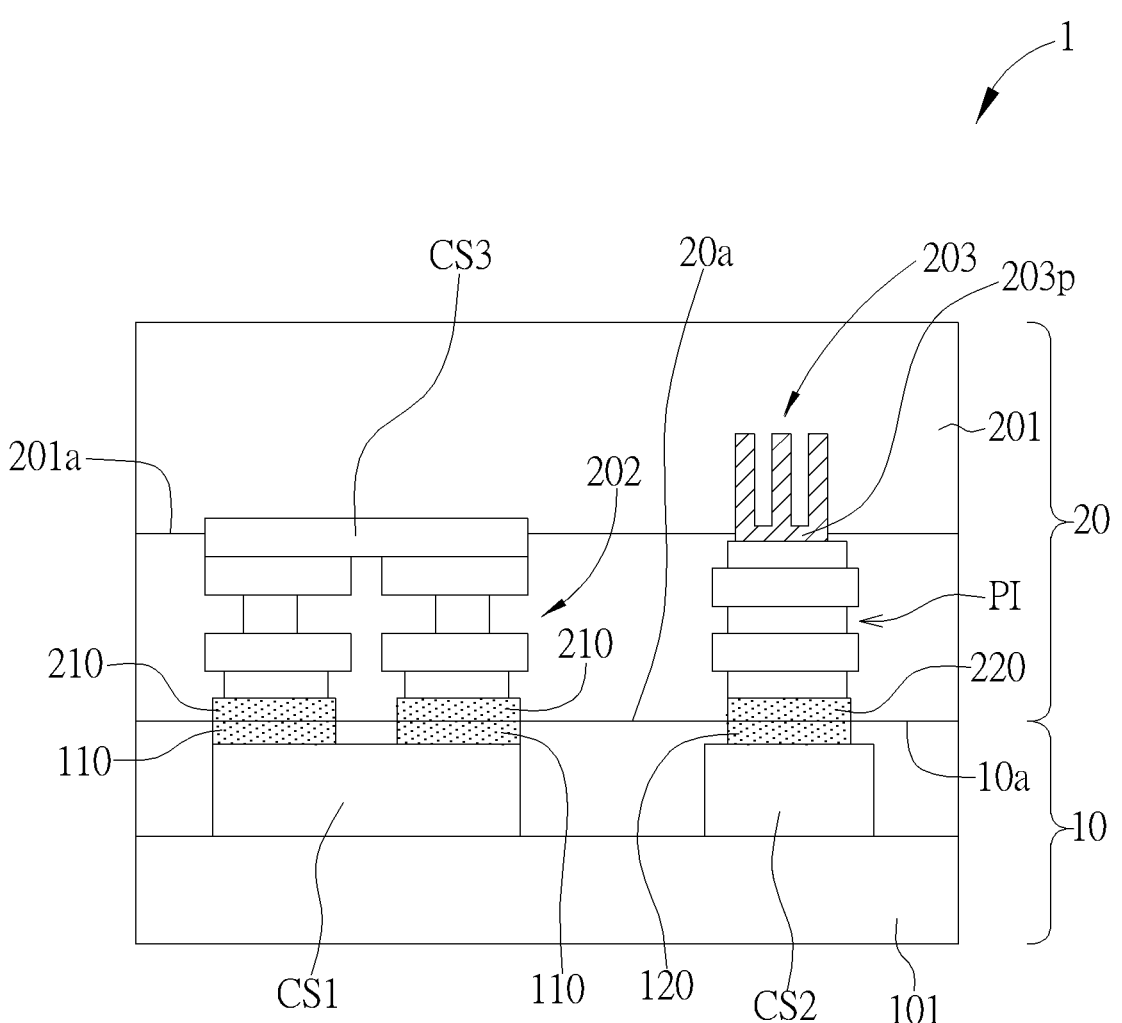
FIG. 1 is a schematic diagram showing an exemplary semiconductor device according to an embodiment of the invention.

FIG. 1 is a schematic diagram showing an exemplary semiconductor device according to an embodiment of the invention. As shown in FIG. 1, the semiconductor device 1 comprises an application processor (AP) die 10 directly bonded to a memory die 20 by using a wafer-on-wafer (WoW) technique. According to an embodiment, the AP die 10 comprises a substrate 101 such as a semiconductor substrate. According to an embodiment, a circuit structure CS1 and a circuit structure CS2 may be fabricated on the substrate 101. According to an embodiment, for example, the circuit structure CS1 and the circuit structure CS2 may include, but not limited to, active elements such as transistors, passive elements such as resistors, capacitors or inductors, Micro Electro-Mechanical System (MEMS) elements, power circuit elements, and/or interconnect metal layers. According to an embodiment, for example, the circuit structure CS1 and the circuit structure CS2 may include, but not limited to, logic circuits and/or analog circuits. According to an embodiment, for example, the circuit structure CS1 may be electrically connected to the circuit structure CS2 through an interconnect structure.

According to an embodiment, for example, a plurality of hybrid bond pads 110 and 120 are disposed on an upper surface 10a of the AP die 10. According to an embodiment, for example, the plurality of hybrid bond pads 110 and 120 may comprise copper pads, but not limited thereto. According to an embodiment, for example, the hybrid bond pads 110 may be non-volatile memory (NVM) pins for transmitting signals such as read, erase, or program signals between the AP die 10 and the memory die 20. According to an embodiment, for example, the hybrid bond pad 120 may be a power pin for transmitting power signals.

According to an embodiment, for example, the memory die 20 may comprise a substrate 201 such as a semiconductor substrate. According to an embodiment, for example, the substrate 201 may be a silicon substrate or a silicon-oninsulator (SOI) substrate, but not limited thereto. According to an embodiment, a circuit structure CS3 may be fabricated on a surface 201a of the substrate 201. According to an embodiment, for example, the circuit structure CS3 may include, but not limited to, active elements such as transistors, passive elements such as resistors, capacitors or inductors, MEMS elements, power circuit elements, and/or interconnect metal layers. According to an embodiment, for example, the circuit structure CS3 may include, but not limited to, logic circuits and/or analog circuits.

According to an embodiment, for example, the memory die 20 may comprise a memory structure 202 fabricated on the substrate 201. According to an embodiment, for example, the memory structure 202 may be electrically connected to the circuit structure CS3. According to an embodiment, for example, the memory structure 202 may include, but not limited to, a magneto-resistive random access memory (MRAM) structure, a resistive random access memory (RRAM) structure, a phase-change random access memory (PCRAM) structure, ferroelectric random access memory (FRAM) structure, embedded flash (eflash) memory structure, or the like.

According to an embodiment, for example, the memory die 20 may further comprise at least a deep trench capacitor (DTC) 203 fabricated in the substrate 201. According to an embodiment, for example, the DTC 203 is a decoupling capacitor. According to an embodiment, for example, a plurality of DTCs 203 can be formed and connected in parallel to provide large capacitance and to greatly increase the capacitance density, thereby enabling the construction of diverse devices such as higher quality power distribution networks (PDNs).

The fabrication of the DTC 203 is known in the art. For example, a deep trench may be etched into the substrate 201. A bottom electrode may be conformally formed in the deep trench. A dielectric layer such as a high k dielectric may be formed to coat the bottom electrode layer by physical vapor deposition (PVD), such as sputtering or pulsed laser deposition, or chemical vapor deposition (CVD), such as MOCVD. A top electrode layer is then formed to fill the remaining space in the deep trench by PVD such as sputtering or pulsed laser deposition or CVD such as MOCVD. For example, the DTC 203 may be high-frequency capacitor that may be used to decouple very high-frequency currents (>10 MHz). According to an embodiment, for example, the DTC 203 may be connected to a DTC pad 203p such as a copper pad.

According to an embodiment, for example, a plurality of hybrid bond pads 210 and 220 are disposed on an upper surface 20a of the memory die 20. According to an embodiment, for example, the plurality of hybrid bond pads 210 and 220 may comprise copper pads, but not limited thereto. According to an embodiment, for example, the hybrid bond pads 210 may be NVM pins for transmitting signals such as read, erase, or program signals between the AP die 10 and the memory die 20. According to an embodiment, for example, the hybrid bond pad 220 may be a power pin for transmitting power signals. According to an embodiment, for example, the hybrid bond pad 220 is electrically connected to the DTC pad 203p through a power supply line PI, thereby reducing chip voltage drop.

According to an embodiment, for example, the hybrid bond pads 210 and 220 are directly bonded to the hybrid bond pads 110 and 120, respectively, through face-to-face bonding or hybrid bonding. According to an embodiment, for example, the hybrid bond pads 210 and 220 are directly bonded to the hybrid bond pads 110 and 120, respectively, through metal-to-metal direct bonding. According to an embodiment, for example, the hybrid bond pads 210 and 220 are directly bonded to the hybrid bond pads 110 and 120, respectively, through copper-to-copper direct bonding.

Figure 2:
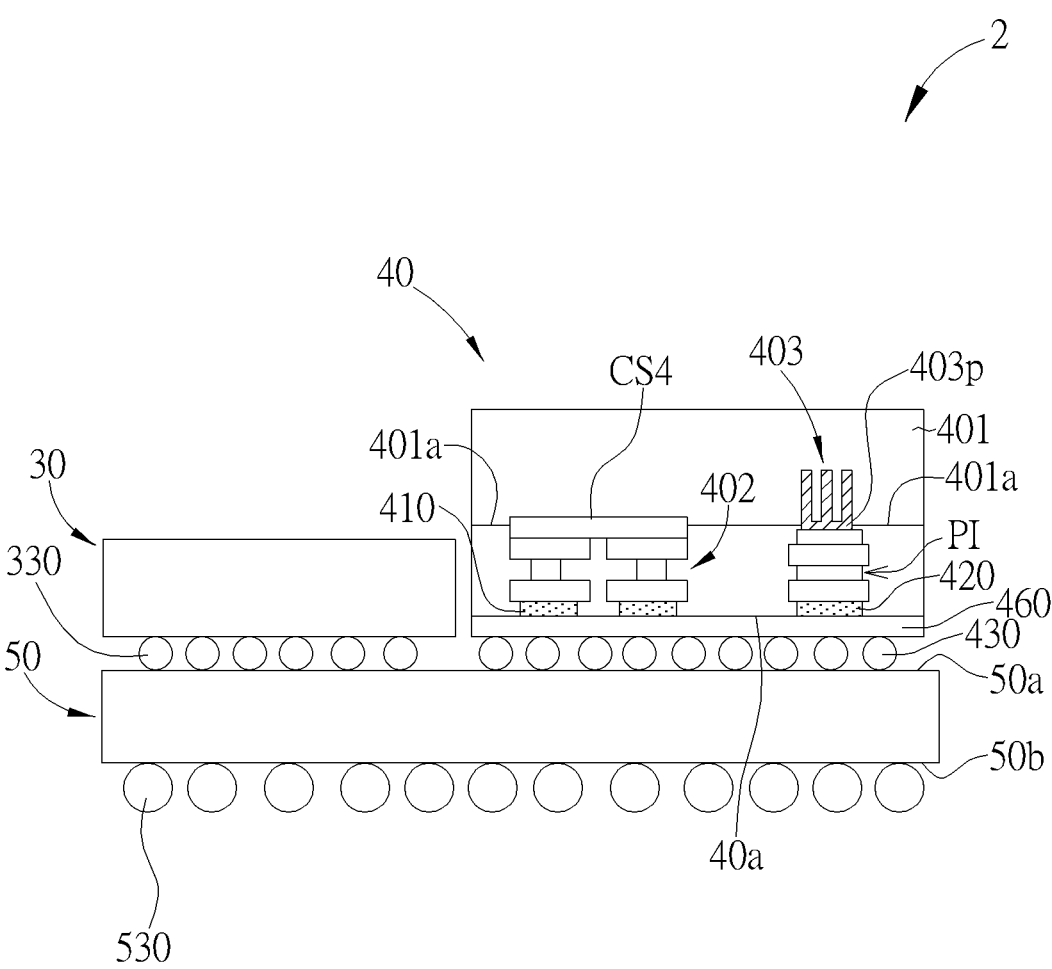
FIG. 2 is a schematic diagram showing an exemplary semiconductor device according to another embodiment of the invention.

FIG. 2 is a schematic diagram showing an exemplary semiconductor device according to another embodiment of the invention. As shown in FIG. 2, the semiconductor device 2 may be a System-in-Package (SiP) comprising an application processor (AP) die 30 and a memory die 40 mounted on an upper surface 50a of a package substrate 50 through connecting elements 330 and 430 such as conductive bumps or solder balls. According to an embodiment, for example, the package substrate 50 may comprise a resin core and multiple buildup metal layers on opposite sides of the resin core (not explicitly shown). According to an embodiment, the AP die 30 may have a structure that is similar to the structure of the AP die 10 depicted in FIG. 1. According to an embodiment, a plurality of connecting elements 530 such as BGA balls may be disposed on a lower surface 50b of the package substrate 50.

According to an embodiment, for example, the memory die 40 may comprise a substrate 401 such as a semiconductor substrate. According to an embodiment, for example, the substrate 401 may be a silicon substrate or a SOI substrate, but not limited thereto. According to an embodiment, a circuit structure CS4 may be fabricated on a surface 401a of the substrate 401. According to an embodiment, for example, the circuit structure CS4 may include, but not limited to, active elements such as transistors, passive elements such as resistors, capacitors or inductors, MEMS elements, power circuit elements, and/or interconnect metal layers. According to an embodiment, for example, the circuit structure CS4 may include, but not limited to, logic circuits and/or analog circuits.

According to an embodiment, for example, the memory die 40 may comprise a memory structure 402 fabricated on the substrate 401. According to an embodiment, for example, the memory structure 402 may be electrically connected to the circuit structure CS4. According to an embodiment, for example, the memory structure 402 may include, but not limited to, a magneto-resistive random access memory (MRAM) structure, a resistive random access memory (RRAM) structure, a phase-change random access memory (PCRAM) structure, ferroelectric random access memory (FRAM) structure, embedded flash (eflash) memory structure, or the like.

According to an embodiment, for example, the memory die 40 may further comprise at least a deep trench capacitor (DTC) 403 fabricated in the substrate 401. According to an embodiment, for example, a plurality of DTCs 403 can be formed and connected in parallel to provide large capacitance and to greatly increase the capacitance density, thereby enabling the construction of diverse devices such as higher quality power distribution networks (PDNs). According to an embodiment, for example, the DTC 403 may be covered with a DTC pad 403p.

According to an embodiment, for example, a plurality of bond pads 410 and 420 are disposed on an upper surface 40a of the memory die 40. According to an embodiment, for example, the plurality of bond pads 410 and 420 may comprise copper pads, but not limited thereto. According to an embodiment, for example, the bond pads 410 may be NVM pins for transmitting signals such as read, erase, or program signals between the AP die 30 and the memory die 40. According to an embodiment, for example, the bond pad 420 may be a power pin for transmitting power signals. According to an embodiment, for example, the bond pad 420 is electrically connected to the DTC pad 403*p* through a power supply line PI, thereby reducing chip voltage drop.

According to an embodiment, for example, a re-distribution layer (RDL) 460 may be disposed on the upper surface 40*a* of the memory die 40 to re-distribute or fan-out the bond pads 410 and 420. The re-distribution layer 460 may be used to reroute connections to desired locations. For example, a bump array located in the center of a chip can be re-distributed to positions near the chip edge. The ability to redistribute points can enable higher contact density and enable subsequent packaging steps. The re-distribution process adds another set of layers over the wafer surface. A dielectric film is deposited for electrical isolation. The original bond pads are then exposed. Metal lines are deposited to relocate the pads to desired locations, and under bump metallization (UBM) layers are built to support the solder bumps.

Figure 3:
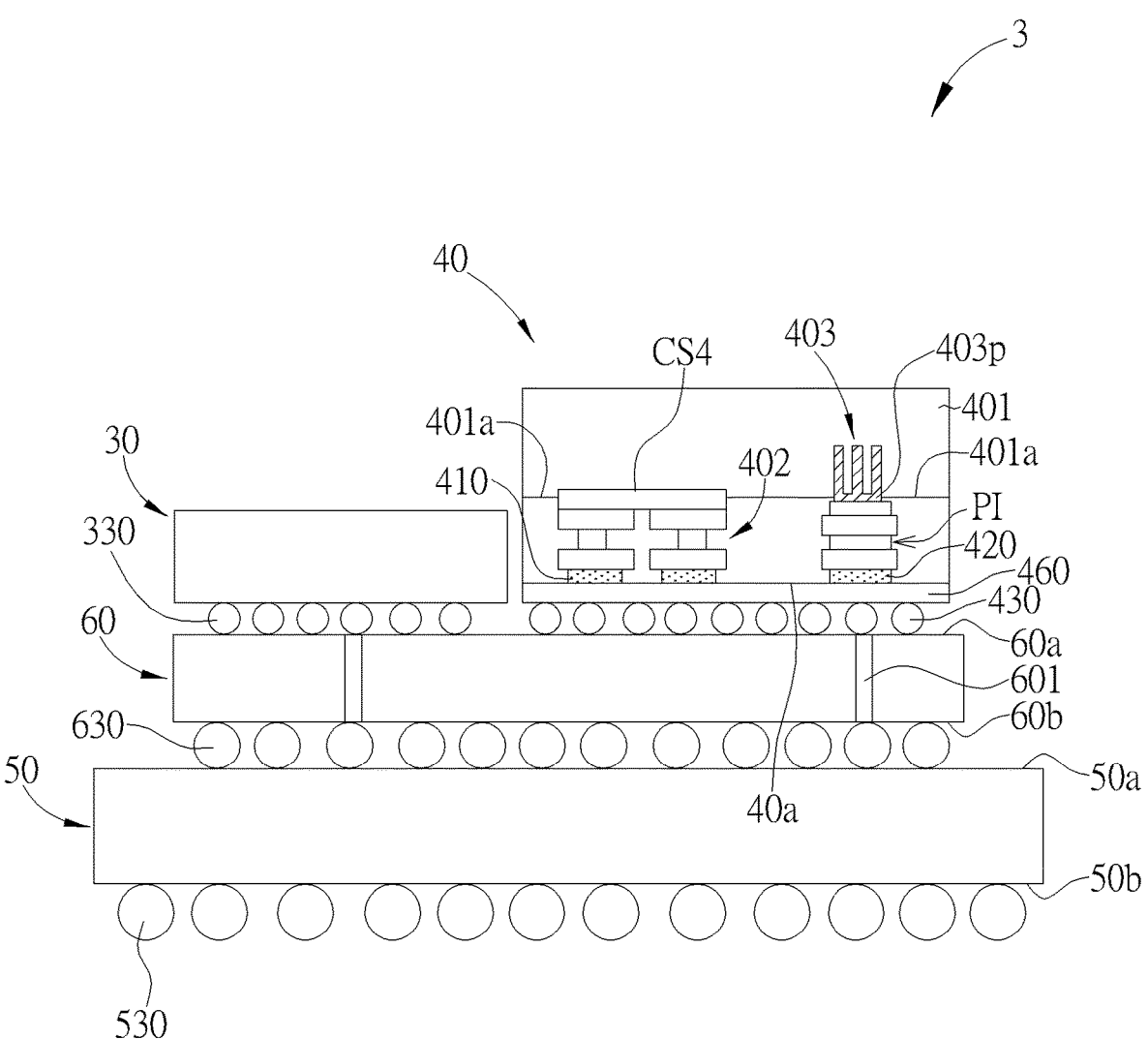
FIG. 3 is a schematic diagram showing an exemplary semiconductor device according to still another embodiment of the invention.

FIG. 3 is a schematic diagram showing an exemplary semiconductor device according to still another embodiment of the invention, wherein like layers, regions, or elements are designated by like numeral numbers or labels. As shown in FIG. 3, the semiconductor device 3 may be a 2.5D package comprising an application processor (AP) die 30 and a memory die 40 mounted on an upper surface 60*a* of an interposer substrate 60 in a side-by-side manner through connecting elements 330 and 430, respectively. According to an embodiment, for example, the interposer substrate 60 may be a silicon interposer, but is not limited thereto. According to an embodiment, for example, the interposer substrate 60 may comprise through silicon vias (TSVs) 601. According to an embodiment, the AP die 30 may have a structure that is similar to the structure of the AP die 10 depicted in FIG. 1. The interposer substrate 60 is mounted on an upper surface 50*a* of a package substrate 50 through connecting elements 630. According to an embodiment, for example, the package substrate 50 may comprise a resin core and multiple buildup layers on opposite sides of the resin core (not explicitly shown). According to an embodiment, a plurality of connecting elements 530 such as BGA balls may be disposed on a lower surface 50*b* of the package substrate 50.

According to an embodiment, likewise, the memory die 40 may comprise a substrate 401 such as a semiconductor substrate. According to an embodiment, for example, the substrate 401 may be a silicon substrate or a SOI substrate, but not limited thereto. According to an embodiment, a circuit structure CS4 may be fabricated on a surface 401*a* of the substrate 401. According to an embodiment, for example, the circuit structure CS4 may include, but not limited to, active elements such as transistors, passive elements such as resistors, capacitors or inductors, MEMS elements, power circuit elements, and/or interconnect metal layers. According to an embodiment, for example, the circuit structure CS4 may include, but not limited to, logic circuits and/or analog circuits.

According to an embodiment, for example, the memory die 40 may comprise a memory structure 402 fabricated on the substrate 401. According to an embodiment, for example, the memory structure 402 may be electrically connected to the circuit structure CS4. According to an embodiment, for example, the memory structure 402 may include, but not limited to, a magneto-resistive random access memory (MRAM) structure, a resistive random access memory (RRAM) structure, a phase-change random access memory (PCRAM) structure, ferroelectric random access memory (FRAM) structure, embedded flash (eflash) memory structure, or the like.

According to an embodiment, for example, the memory die 40 may further comprise at least a deep trench capacitor (DTC) 403 fabricated in the substrate 401. According to an embodiment, for example, a plurality of DTCs 403 can be formed and connected in parallel to provide large capacitance and to greatly increase the capacitance density, thereby enabling the construction of diverse devices such as higher quality power distribution networks (PDNs). According to an embodiment, for example, the DTC 403 may be covered with a DTC pad 403*p*.

According to an embodiment, for example, a plurality of bond pads 410 and 420 are disposed on an upper surface 40*a* of the memory die 40. According to an embodiment, for example, the plurality of bond pads 410 and 420 may comprise copper pads, but not limited thereto. According to an embodiment, for example, the bond pads 410 may be NVM pins for transmitting signals such as read, erase, or program signals between the AP die 30 and the memory die 40. According to an embodiment, for example, the bond pad 420 may be a power pin for transmitting power signals. According to an embodiment, for example, the bond pad 420 is electrically connected to the DTC pad 403*p* through a power supply line PI, thereby reducing chip voltage drop.

According to an embodiment, for example, a re-distribution layer (RDL) 460 may be disposed on the upper surface 40*a* of the memory die 40 to re-distribute or fan-out the bond pads 410 and 420. The re-distribution layer 460 may be used to reroute connections to desired locations. For example, a bump array located in the center of a chip can be re-distributed to positions near the chip edge. The ability to redistribute points can enable higher contact density and enable subsequent packaging steps. The re-distribution process adds another set of layers over the wafer surface. A dielectric film is deposited for electrical isolation. The original bond pads are then exposed. Metal lines are deposited to relocate the pads to desired locations, and under bump metallization (UBM) layers are built to support the solder bumps.

Figure 4:
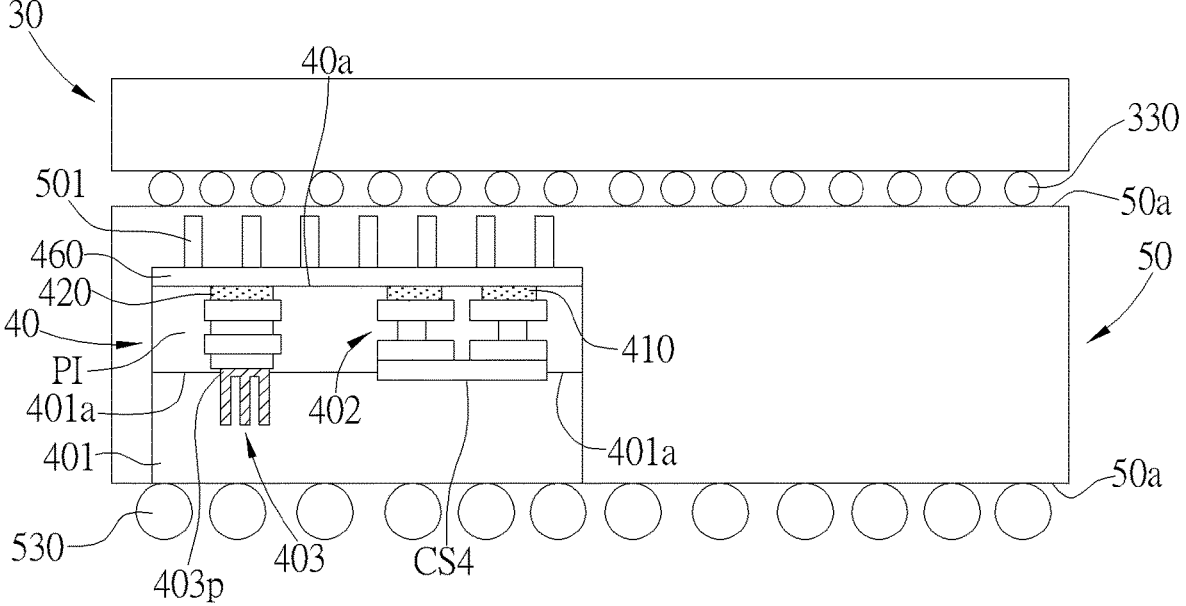
FIG. 4 is a schematic diagram showing an exemplary semiconductor device according to yet another embodiment of the invention.

FIG. 4 is a schematic diagram showing an exemplary semiconductor device according to yet another embodiment of the invention, wherein like layers, regions, or elements are designated by like numeral numbers or labels. As shown in FIG. 4, the semiconductor device 3 may be an embedded die package comprising an application processor (AP) die 30 mounted on an upper surface 50*a* of a package substrate 50 and a memory die 40 embedded in the package substrate 50. The AP die 30 may be mounted on the package substrate 50 through connecting elements 330. The memory die 40 may be electrically connected to the AP die 30 or other components on or in the substrate through an interconnect structure 601501 such as copper-plated vias and conductive traces of the package substrate 50. According to an embodiment, for example, the package substrate 50 may comprise a resin core and multiple buildup layers on opposite sides of the resin core (not explicitly shown). According to an embodiment, a plurality of connecting elements 530 such as BGA balls may be disposed on a lower surface 50*b* of the package substrate 50.

According to an embodiment, likewise, the memory die 40 may comprise a substrate 401 such as a semiconductor substrate. According to an embodiment, for example, the substrate 401 may be a silicon substrate or a SOI substrate, but not limited thereto. According to an embodiment, a circuit structure CS4 may be fabricated on a surface 401*a* of the substrate 401. According to an embodiment, for example, the circuit structure CS4 may include, but not limited to, active elements such as transistors, passive elements such as resistors, capacitors or inductors, MEMS elements, power circuit elements, and/or interconnect metal layers. According to an embodiment, for example, the circuit structure CS4 may include, but not limited to, logic circuits and/or analog circuits.

According to an embodiment, for example, the memory die 40 may comprise a memory structure 402 fabricated on the substrate 401. According to an embodiment, for example, the memory structure 402 may be electrically connected to the circuit structure CS4. According to an embodiment, for example, the memory structure 402 may include, but not limited to, a magneto-resistive random access memory (MRAM) structure, a resistive random access memory (RRAM) structure, a phase-change random access memory (PCRAM) structure, ferroelectric random access memory (FRAM) structure, embedded flash (eflash) memory structure, or the like.

According to an embodiment, for example, the memory die 40 may further comprise at least a deep trench capacitor (DTC) 403 fabricated in the substrate 401. According to an embodiment, for example, a plurality of DTCs 403 can be formed and connected in parallel to provide large capacitance and to greatly increase the capacitance density, thereby enabling the construction of diverse devices such as higher quality power distribution networks (PDNs). According to an embodiment, for example, the DTC 403 may be covered with a DTC pad 403p.

According to an embodiment, for example, a plurality of bond pads 410 and 420 are disposed on an upper surface 40a of the memory die 40. According to an embodiment, for example, the plurality of bond pads 410 and 420 may comprise copper pads, but not limited thereto. According to an embodiment, for example, the bond pads 410 may be NVM pins for transmitting signals such as read, erase, or program signals between the AP die 30 and the memory die 40. According to an embodiment, for example, the bond pad 420 may be a power pin for transmitting power signals. According to an embodiment, for example, the bond pad 420 is electrically connected to the DTC pad 403p through a power supply line PI, thereby reducing chip voltage drop.

According to an embodiment, for example, a re-distribution layer (RDL) 460 may be disposed on the upper surface 40a of the memory die 40 to re-distribute or fan-out the bond pads 410 and 420. The re-distribution layer 460 may be used to reroute connections to desired locations. For example, a bump array located in the center of a chip can be re-distributed to positions near the chip edge. The ability to redistribute points can enable higher contact density and enable subsequent packaging steps. The re-distribution process adds another set of layers over the wafer surface. A dielectric film is deposited for electrical isolation. The original bond pads are then exposed. Metal lines are deposited to relocate the pads to desired locations, and under bump metallization (UBM) layers are built to support the solder bumps.

It is advantageous to use the instant application because the DTCs are integrated with the NVM memory die. The size and production cost of the AP die can be reduced. Further, the DTCs that function as decoupling capacitors are placed on the power supply line, and therefore the chip voltage drop can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
an application processor (AP) die; and
a memory die directly bonded to the AP die, wherein the memory die comprises a substrate, a non-volatile memory structure on the substrate, and at least one trench capacitor in the substrate, wherein a first hybrid bond pad and a second hybrid bond pad are disposed on an upper surface of the memory die, wherein the first hybrid bond pad is a memory pin for transmitting read, erase, or program signals between the AP die and the memory die, and the second hybrid bond pad is a power pin for transmitting power signals.

2. The semiconductor device according to claim 1, wherein the at least one trench capacitor is a decoupling capacitor.

3. The semiconductor device according to claim 1, wherein the non-volatile memory structure comprises a magneto-resistive random access memory (MRAM) structure, a resistive random access memory (RRAM) structure, ferroelectric random access memory (FRAM) structure, embedded flash (eflash) memory structure, or a phase-change random access memory (PCRAM) structure.

4. The semiconductor device according to claim 1, wherein the at least one trench capacitor is electrically connected to the second hybrid bond pad.

5. The semiconductor device according to claim 1, wherein the first and second hybrid bond pads are directly bonded to third and fourth hybrid bond pads on the AP die, respectively, through hybrid bonding.

6. The semiconductor device according to claim 5, wherein the first hybrid bond pad, the second hybrid bond pad, the third hybrid bond pad, and the fourth hybrid bond pad are copper pads.

7. The semiconductor device according to claim 1, wherein the at least one trench capacitor is connected to a pad.

8. The semiconductor device according to claim 7, wherein the second hybrid bond pad is electrically connected to the pad through a power supply line.

9. A semiconductor device, comprising:
an application processor (AP) die; and
a memory die directly bonded to the AP die, wherein the memory die comprises a substrate, a non-volatile memory structure on the substrate, and at least one trench capacitor in the substrate, wherein a first hybrid bond pad and a second hybrid bond pad are disposed on an upper surface of the memory die, wherein the first and second hybrid bond pads are directly bonded to third and fourth hybrid bond pads on the AP die, respectively, through hybrid bonding.

10. The semiconductor device according to claim 9, wherein the first hybrid bond pad, the second hybrid bond pad, the third hybrid bond pad, and the fourth hybrid bond pad are copper pads.

\* \* \* \* \*